US006231666B1

(12) United States Patent
Clem et al.

(10) Patent No.: US 6,231,666 B1
(45) Date of Patent: May 15, 2001

(54) PROCESS FOR FORMING EPITAXIAL PEROVSKITE THIN FILM LAYERS USING HALIDE PRECURSORS

(75) Inventors: Paul G. Clem; Mark A. Rodriguez, both of Albuquerque; James A. Voigt, Corrales; Carol S. Ashley, Albuquerque, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/356,810

(22) Filed: Jul. 20, 1999

(51) Int. Cl.$^7$ .............................. C30B 5/00; C30B 7/00; C30B 7/02
(52) U.S. Cl. .................... 117/4; 117/68; 117/70
(58) Field of Search ............................. 117/4, 5, 68, 70

(56) References Cited

U.S. PATENT DOCUMENTS

| 5,146,299 | * | 9/1992 | Lampe et al. .................. 357/23.5 |
| 5,231,074 | * | 7/1993 | Cima et al. ........................ 505/1 |
| 5,509,189 | * | 4/1996 | Tuller et al. ..................... 29/623.1 |
| 5,650,362 | * | 7/1997 | Nashimota et al. ............... 437/243 |
| B1 6,180,252 | * | 1/2001 | Farrel et al. ..................... 428/469 |

OTHER PUBLICATIONS

Ronald H. Baney, Debora F. Bergstrom, and Bruce H. Justice, *Metal Iodides: Novel Solution Precursors to Cuprate Superconductors*, American Chemical Society, 0897–4756/92/2804–0984, 1992.

Paul C. McIntyre, Michael J. Cima, and Man Fai Ng, *Metalorganic Deposition of high $J_c Ba_2 Ycu_3 O_{7-x}$ Thin Films from Trifluoroaecetate Precursors onto (100) $SrTiO_3$*, Journal of Applied Physics, 68(8), Oct. 15, 1990.

Paul C. McIntyre, Michael J. Cima, John A. Smith, Jr., Robert B. Hallock, Michael P. Siegal and Julia M. Phillips, *Effect of Growth Conditions on the Properties and Morphology of Chemically Derived Epitaxial Thin Films of $Ba_2 Ycu_3 O_{7-x}$ on (001) $LaAIO_3$*, Journal of Applied Physics 71(4), Feb. 15, 1992.

Paul C. McIntyre and Michael J. Cima, *Heteroepitaxial Growth of Chemically Derived ex situ $Ba_2 Ycu_3 O_{7-x}$ Thin Films*, J. Mater Res., vol. 9, No. 9, Sep. 1994.

P. C. McIntyre, M. J. Cima, A. Roshko, *Epitaxial Nucleation and Growth of Chemically Derived $Ba_2 Ycu_3 O_{7-x}$ Thin Films on (001) ) $SrTiO_3$*, Journal of Applied Physics 77(10), May 15, 1995.

* cited by examiner

Primary Examiner—Benjamin L. Utech
Assistant Examiner—Matthew Anderson
(74) Attorney, Agent, or Firm—Gregory A. Cone

(57) ABSTRACT

A process for forming an epitaxial perovskite-phase thin film on a substrate. This thin film can act as a buffer layer between a Ni substrate and a $YBa_2 Cu_3 O_{7-x}$ superconductor layer. The process utilizes alkali or alkaline metal acetates dissolved in halogenated organic acid along with titanium isopropoxide to dip or spin-coat the substrate which is then heated to about 700° C. in an inert gas atmosphere to form the epitaxial film on the substrate. The YBCO superconductor can then be deposited on the layer formed by this invention.

28 Claims, 1 Drawing Sheet

PROCESS FOR FORMING EPITAXIAL PEROVSKITE THIN FILM LAYERS USING HALIDE PRECURSORS

STATEMENT REGARDING FEDERALLY SPONSORED RESEARCH

This invention was made with Government support under Contract DE-AC04-94AL85000 awarded by the U.S. Department of Energy. The Government has certain rights in this invention.

CROSS-REFERENCE TO RELATED APPLICATIONS

Not applicable.

REFERENCE TO A MICROFICHE APPENDIX

Not applicable.

BACKGROUND OF THE INVENTION

This invention relates to methods for forming epitaxial thin films of perovskite materials via chemical solution deposition. More particularly this invention relates to methods for forming such films through the use of halide precursors. This invention also relates to methods for forming buffer layers to lie between YBCO superconductor layers and metallic or single crystal oxide substrates.

Tremendous interest exists for use of high temperatures superconducting cables for AC power transmission, as roughly half the electric power produced in the U.S. is lost over power lines before reaching the end customer. Production of flexible, kilometer lengths of superconducting wire or tape would enable zero-resistance current transport, recovering this lost power. A major challenge to attaining this goal is achieving a low-cost, high throughput method of producing flexible, epitaxial superconducting films on such length scales. This invention teaches a major advance in production of epitaxial films on flexible, inexpensive base-metal tapes, which enable low-cost, continuous processing of such wires, and other products.

To achieve a needed superconducting power handling capability of about $10^6$ A/cm$^2$, epitaxial or single crystal-like superconducting films of $YBa_2Cu_3O_{7-x}$ (YBCO) or similar materials are required. Production of such films likely requires use of a substrate with a similar atomic lattice structure to template crystalline growth. Through cold-rolling of nickel wire, long lengths of (200) oriented nickel tape have been demonstrated by Oak Ridge National Laboratory and others, enabling the required length scales of lattice-matched, oriented, and relatively inexpensive substrates. Superconducting materials such as YBCO would react chemically if deposited directly on nickel. Therefore, some sort of buffer layer is necessary between the YBCO and the nickel substrate.

BRIEF SUMMARY OF THE INVENTION

This unmet need, as well as others, can be satisfied by the method of the present invention which is a chemical solution deposition (CSD) technique that enables production of epitaxial buffer layers atop oriented oxide or nickel substrates, and subsequent CSD of epitaxial YBCO atop these buffer layers. This method enables inexpensive production of epitaxial superconductor/buffer layer/oriented nickel tape structures at low processing temperatures. This CSD method enables continuous processing of kilometer lengths of superconducting wire at much smaller expense than competing vapor phase deposition processes including chemical vapor deposition, sputtering, electron beam evaporation, or pulsed laser deposition. In addition, the ability to integrate such oxide buffer layers, as $BaTiO_3$ on Ni is a major advance for production of multilayer ceramic capacitors. Ni electrodes are much less costly than the silver, silver/palladium, or platinum electrodes normally used for these applications. As electrode costs in half the expense for such capacitors, such an advance is significant.

DETAILED DESCRIPTION OF THE INVENTION

Figure 1:
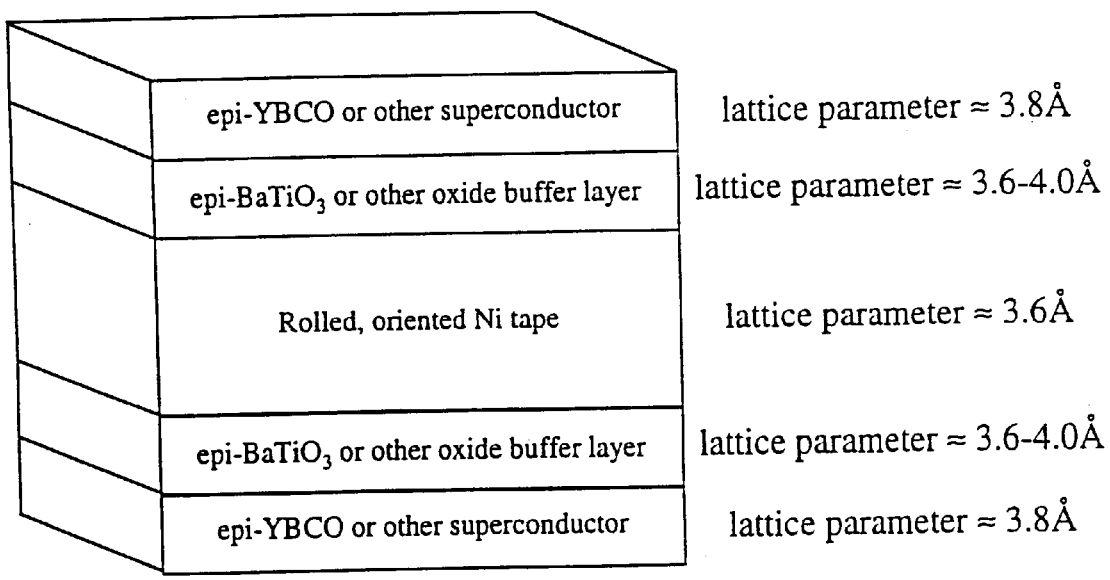
FIG. 1 is an isometric diagram of an idealized cross section of a central substrate of oriented Ni tape on which perovskite buffer layers have been grown on which in turn have been grown YBCO layers.

Three major complications exist in attempts to produce epitaxial superconducting layers on flexible substrates: (1) reaction/diffusion of the superconductor with substrate materials such as Ni, (2) oxidation of Ni or other base metal substrates, and (3) formation of intermediate phases such as $BaCO_3$, which interrupts epitaxial registry of the overlying YBCO layers. This invention solves all three of these problems in an efficient, low cost process. It should also be added that the layer formed by this process has other uses as well. However, the discussion immediately below will concentrate on its application to the YBCO problem.

Process for Forming the Buffer Layer

For the YBCO case, the buffer layer prevents reaction of the YBCO with the underlying Ni substrate but maintains the atomic registry of the oriented Ni substrate to allow epitaxial structures of $YBCO(100)//ABO_3(100)//Ni(100)$, where $ABO_3$ denotes a generic perovskite structure oxide buffer layer. The same technique may be used for any oxide buffer layer that has similar lattice match to the top superconductor layer and nickel underlayer. As mentioned above, a continuous process is desirable for production of kilometer lengths of wire or tape.

By use of the present process, buffer layers of $BaTiO_3$ and $SrTiO_3$ were deposited atop the Ni by a fluorinated CSD process. $BaTiO_3$ and $SrTiO_3$ typically form via $BaCO_3$ and $SrCO_3$ intermediate carbonate phases, which decompose slowly and generally yield polycrystalline (non-epitaxial) films. Ba, Sr, and most of the other Column I alkali and Column II alkaline earth metals form carbonate phases upon exposure to $CO_2$ in the atmosphere or $CO_2$ resulting from decomposition of alcohols or other organics (e.g. $Ba+CH_3OH+3/2\ O_2 \rightarrow BaCO_3+2H_2O$).

To avoid this problem, the inventors herein developed an alternative approach to use fluorinated precursors to form $BaF_2$ and $SrF_2$ instead of the carbonates found in the prior art, followed by crystallization of $BaTiO_3$ and $SrTiO_3$ without the undesirable carbonate formation. Although the specific use of trifluoroacetic acid additions has been taught for use in epitaxial deposition of YBCO, its use has not been extended to the production of perovskite thin films such as $BaTiO_3$ or $SrTiO_3$. Returning to the process, barium and strontium acetates are dissolved in trifluoroacetic acid (TFA), to which titanium isopropoxide is added, forming the precursor solution. This solution is then dip- or spin-coated onto nickel or single crystal oxide substrates to form films of 30–100 nm thickness. The films are heated to 100° C. on a hot plate, then to 400° C. in an inert gas (Ar, $N_2$ or $N_2H_2$) atmosphere together with water vapor or $H_2$, and finally to 700–800° C. in a dry inert gas (Ar, $N_2$) atmosphere. This process produced epitaxial films of $BaTiO_3$ and $SrTiO_3$ on Ni, without evidence of Ni oxidation which would disrupt epitaxial growth. Rapid heat treatment of spin-coated coated Ba acetate/Ti isopropoxide/TFA films on single crystal MgO (100) substrates produced epitaxial (100) oriented $BaTiO_3$ films as well. Using time-resolved x-ray diffraction, the crystallization of epitaxial $BaTiO_3$ is observed immediately upon heating a film from 400° C. to 800° C. It is understood that the formation of epitaxial films in enable by formation of a liquid Ba phase at around 730° C., as indicated by the Ba-$BaF_2$ phase diagram. Use of this $BaF_2$ or a $SrF_2$ phase enables epitaxial films of (100) $BaTiO_3$ on the aforementioned rolled (200) Ni tape and oriented (100) $SrTiO_3$ on single crystal oxides such as MgO and $LaAlO_3$. These depositions have been reduced to practice. Similar results would be expected from the use of other halides such as chlorine, bromine, and iodine (see R. H. Baney, D. F. Bergstrom, and B. H. Justice, Chem. Mater. 4, 984 (1992)). Likewise, the perovskite metal oxides should be able to be extended beyond Ba and Sr to the rest of the column I alkali metals and column II alkaline earth metals as well as at least some of the rare earth metals such as Nd and Er.

Avoidance of Ni Oxidation

Ni oxidizes in the presence of $O_2$ or $H_2O$ at high temperature (>400° C.). Such oxidation is to be avoided, since formation of such a randomly oriented NiO layer atop Ni would result in the inability to template epitaxial oxide films on the Ni. By the use of fluorinated buffer layer precursors herein, the use of a dry $N_2$ or Ar atmosphere above 400° C. was found to be effective in avoiding formation of NiO, thus enable deposition of $BaTiO_3$ on top of the Ni. Presence of $H_2O$ above 400° C. was found to lead to formation of NiO on the randomly oriented Ni substrates, while use of dry atmospheres avoided this problem. A wet atmosphere was used below 400° C. to aid in removal of organics, and aid in conversion of $BaF_2/SrF_2$ to oxides. The composite process enables crystallization of $BaTiO_3$ at 700–800° C. directly on Ni, in a dry $N_2$ or Ar environment. This ability to avoid oxidation of Ni substrates or electrodes enables both superconducting and multilayer capacitor applications for this process.

Chemical Solution Deposition of YBCO//buffer Layer//oriented Ni Structures

Building upon the process presented above, once the buffer layer//oriented Ni structure is formed, the final goal is the deposition of YBCO on top of the buffer layer. Using the teachings of Cima (see P. C. McIntyre, M. J. Cima, and M. R. Ng, J. Appl Phys. 68(8), 4183 (1990); P. C. McIntyre, M. J. Cima, J. A. Smith Jr., R. B. Hallock, M. P. Siegal, and J. M. Phillips, J. Appl. Phys. 71(4), 1868 (1992); P. C. McIntyre, M. J. Cima, J. Mater. Res. 9(9), 2219 (1994); and P. C. McIntyre, M. J. Cima, and A. Roshko, J. Appl. Phys. 77 (10), 5263 (1995)—all of which are incorporated by reference herein), epitaxial YBCO was deposited by CSD on $BaTiO_3$//MgO and $SrTiO_3$//$LaAlO_3$ structures. This demonstrates that Ni or single crystal substrates can be used to template CSD epitaxial perovskite layers such as $BaTiO_3$ and $SrTiO_3$ and that these perovskite layers can be successfully overgrown with epitaxial YBCO. In practice, a YBCO//perovskite buffer//rolled nickel structure would normally be two sided as shown in FIG. 1. FIG. 1 also shows the lattice parameters needed in this case to achieve effective templating of the various epitaxial layers with one another.

Proper heat treatment of TFA- and other halide-based precursors enables avoidance of alkali and alkaline earth carbonate phases in a wide variety of ceramic/perovskite thin films. The low temperatures (400–800° C.) used in this process enable integration of perovskite oxides with materials such as Ni without oxidation of such base-metal electrodes.

Other modifications of the present process are possible. For example, rare earth metal oxides may be included along with the Ti oxide as part of the perovskite thin film. When Er or Nd are include in concentrations if the 1000's of ppm range, light amplification within the layer may be possible. Also, there are applications where the perovskite layer is the functional layer, rather than a buffer layer. When deposited on a single crystal film of lower refractive index, a perovskite film such as $BaTiO_3$ can serve as an epitaxial optical waveguide or in other applications.

It will be apparent that various modifications can be made to the basic process and to add other alternative materials as substitutions for those listed specifically mentioned above. The true scope of the invention is found below in the appended claims.

What is claimed is:

1. A process to form an epitaxial perovskite-phase thin film on an oxide single crystal or an oxidizable base metal substrate comprising:
   dissolving an alkali or alkaline metal organic salt in a halogenated organic acid;
   adding a solution of an organic salt of titanium to form a precursor solution;
   applying the precursor solution to the substrate; and
   heating the substrate with the applied precursor solution to above about 700° C. in an inert gas atmosphere to form the epitaxial perovskite-phase thin film on the substrate.

2. The process of claim 1 wherein the alkali or alkaline metal is Ba or Sr.

3. The process of claim 2 wherein the organic salt is Ba acetate or Sr acetate and the organic salt of titanium is titanium isopropoxide.

4. The process of claim 1 wherein the substrate is a base metal.

5. The process of claim 4 wherein the base metal is Ni.

6. The process of claim 1 wherein the perovskite-phase thin film is $BaTiO_3$ or $SrTiO_3$.

7. The process of claim 1 wherein the halogen in the halogenated organic acid is F.

8. The process of claim 7 wherein the halogenated organic acid is trifluoroacetic acid.

9. The process of claim 1 wherein the substrate is a perovskite- or rock salt-structure oxide single crystal.

10. The process of claim 9 wherein the substrate is MgO or $LaAlO_3$.

11. A process to form an epitaxial perovskite-phase thin film on an oxidizable base metal substrate comprising:
    dissolving an alkali or alkaline metal organic salt in a halogenated organic acid;
    adding a solution of an organic salt of titanium to form a precursor solution;
    applying the precursor solution to the base metal substrate;
    heating the base metal substrate with the applied precursor solution to about 400° C. in an inert gas atmosphere that also contains water vapor or $H_2$; and
    heating the base metal substrate to a temperature above 700° C. in a dry inert atmosphere to form an epitaxial perovskite-phase thin film on the substrate.

12. The process of claim 11 wherein the alkali or alkaline metal is Ba or Sr.

13. The process of claim 11 wherein the organic salt is Ba acetate or Sr acetate and the organic salt of titanium is titanium isopropoxide.

14. The process of claim 11 where in the base metal is Ni.

15. The process of claim 11 wherein the perovskite-phase thin film is $BaTiO_3$ or $SrTiO_3$.

16. The process of claim 11 wherein the halogen in the halogenated organic acid is F.

17. The process of claim 16 wherein the halogenated organic acid is trifluoroacetic acid.

18. The process of claim 11 including an additional step of depositing $YBa_2CU_3O_{7-x}$ on top of the buffer layer.

19. A process to form an epitaxial perovskite-phase thin film on an oxide single crystal substrate comprising:
dissolving an alkali or alkaline metal organic salt in a halogenated organic acid;
adding a solution of an organic salt of titanium to form a precursor solution;
applying the precursor solution to the substrate; and
heating the substrate with the applied precursor solution to above about 700° C. in an inert gas atmosphere containing water vapor to $H_2$ to form the epitaxial perovskite-phase thin film on the substrate.

20. The process of claim 19 wherein the alkali or alkaline metal is Ba or Sr.

21. The process of claim 19 wherein the organic salt is Ba acetate or Sr acetate and the organic salt of titanium is titanium isopropoxide.

22. The process of claim 19 wherein the substrate is a perovskite- or rock salt-structure oxide single crystal.

23. The process of claim 22 wherein the oxide single crystal is MgO or La $AlO_3$.

24. The process of claim 19 wherein the perovskite-phase thin film is $BaTiO_3$ or $SrTiO_3$.

25. The process of claim 19 wherein the halogen in the halogenated organic acid is F.

26. The process of claim 25 wherein the halogenated organic acid is trifluoroacetic acid.

27. The process of claim 19 wherein the step of adding an organic salt of titanium additionally includes adding a rare earth alkoxide.

28. The process of claim 27 wherein the rare earth is Er or Nd and the concentration is in the range of a thousand ppm.

* * * * *